US012615739B1

(12) United States Patent
An et al.

(10) Patent No.: US 12,615,739 B1
(45) Date of Patent: Apr. 28, 2026

(54) HOLDER AND CONTAINMENT FEATURE FOR MULTI-CHIP BASEBOARD

(71) Applicant: AMD Design, LLC, Wilmington, DE (US)

(72) Inventors: Chen An, Secaucus, NJ (US); Mahesh Kumar Varrey, Secaucus, NJ (US); Oghenerukevwe Ayanruoh, Secaucus, NJ (US); Sruti Chigullapalli, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 329 days.

(21) Appl. No.: 18/350,088

(22) Filed: Jul. 11, 2023

(51) Int. Cl.
*H05K 7/20* (2006.01)

(52) U.S. Cl.
CPC ..... *H05K 7/20272* (2013.01); *H05K 7/20254* (2013.01)

(58) Field of Classification Search
CPC ........... H05K 7/20327; H05K 7/20772; H05K 7/20272; H05K 7/20236; H05K 7/20781; H05K 7/20818
See application file for complete search history.

(56) References Cited

U.S. PATENT DOCUMENTS

| | | | | |
|---|---|---|---|---|
| 5,131,859 A | * | 7/1992 | Bowen | H01R 13/005 |
| | | | | 361/689 |
| 2014/0078672 A1 | * | 3/2014 | Brunschwiler | H05K 7/20772 |
| | | | | 361/699 |
| 2018/0337377 A1 | * | 11/2018 | Stephens | H01M 50/224 |
| 2020/0398652 A1 | * | 12/2020 | Stephens | B62D 25/025 |
| 2021/0092879 A1 | * | 3/2021 | Chen | H05K 7/20272 |
| 2023/0276599 A1 | * | 8/2023 | Zhang | H05K 7/1487 |
| 2024/0006684 A1 | * | 1/2024 | Maguire | H01M 10/6568 |
| 2024/0114649 A1 | * | 4/2024 | Chigullapalli | H05K 7/20272 |
| 2024/0224466 A1 | * | 7/2024 | An | F16L 37/12 |
| 2025/0169033 A1 | * | 5/2025 | Varrey | H05K 7/20781 |

* cited by examiner

*Primary Examiner* — Adam B Dravininkas
(74) *Attorney, Agent, or Firm* — Dergosits & Noah LLP; Todd A. Noah

(57) ABSTRACT

A system and apparatus are provided for containing leakage in a cooling system, thereby preventing the leakage from contacting sensitive electronic devices. A containment tray is configured to cover the surface of one or more cold plates and the electronic devices beneath. The containment tray includes an access port in the base of the containment tray for each cold plate. Hydraulic fitting connections on each cold plate pass up through the access ports and are connected to a coolant supply system. The containment tray is clamped to the cold plates with the gaskets creating a seal between the cold plate and the containment tray. Thus, the containment tray is positioned to collect leakage from the coolant supply system connected to an above the cold plates and electronic devices beneath.

18 Claims, 19 Drawing Sheets

274

276

HOLDER AND CONTAINMENT FEATURE FOR MULTI-CHIP BASEBOARD

BACKGROUND

Typically, high performance computing systems, which employ devices such as GPU and APU, have multiple such devices on a single baseboard to achieve, e.g., highspeed communication and calculation. APUs and GPUs typically have 4 to 8 devices on a baseboard. As a result, the space available to access these devices is limited.

If liquid cooling is added, the ability to access and service the devices is further negatively impacted. Furthermore, the addition of liquid cooling will introduce the potential for leakage to cause device failures. With such liquid cooling, the associated supply and return tubing is susceptible to kinking or becoming damaged.

Thus, what is needed is an apparatus that reduces the potential negative impact on device performance from leaks in a liquid cooling system.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a containment tray that may be clamped to a cold plate, or a plurality of cold plates, with a gasket on each cold plate providing a seal between the tray and that cold plate. In embodiments, the tray includes one or more access chimneys that permits fasteners to be inserted through the tray and be used to connect the cold plates to a heat-producing devices, such as a GPU or APU. Thus, embodiments may be used during assembly to guide and drop the cold plate, or the plurality of cold plates, into position atop the devices. When installed, the containment tray remains and provides protection against leakage of the cold plate system. In an embodiment, a series of such containment trays provides a leak path from a first containment tray to a second containment tray, and from the second containment tray to a spill zone outside of the chassis, thus preventing damage to the chassis electronics.

Figure 1:
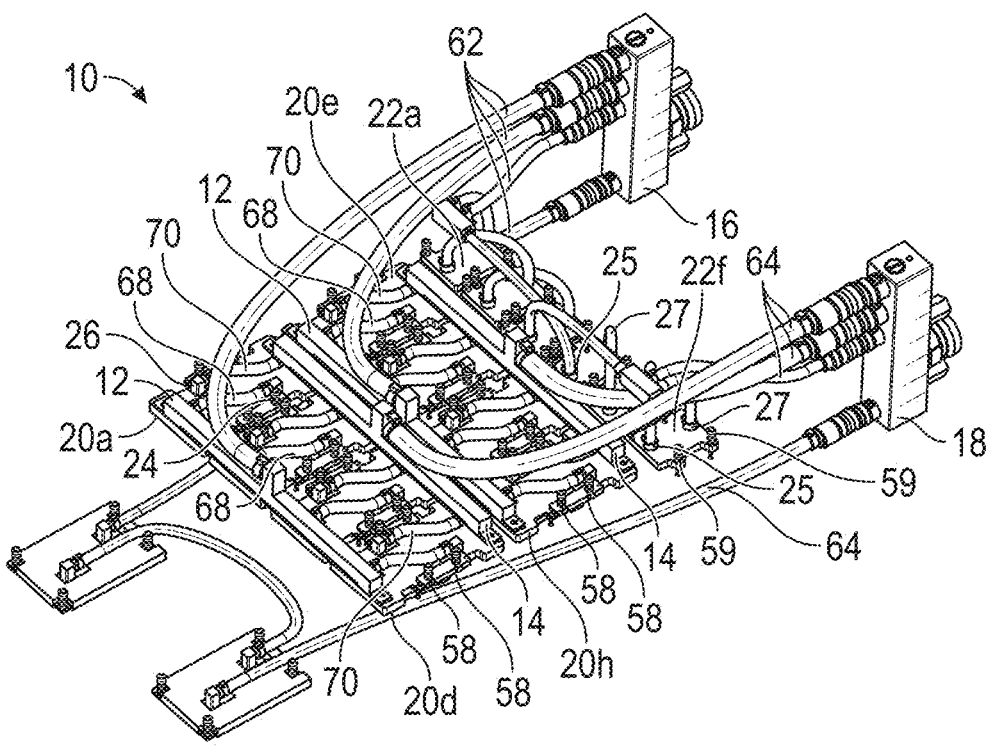
FIG. 1 is an upper right front perspective view illustrating a liquid cooling system of the prior art.
Figure 7:
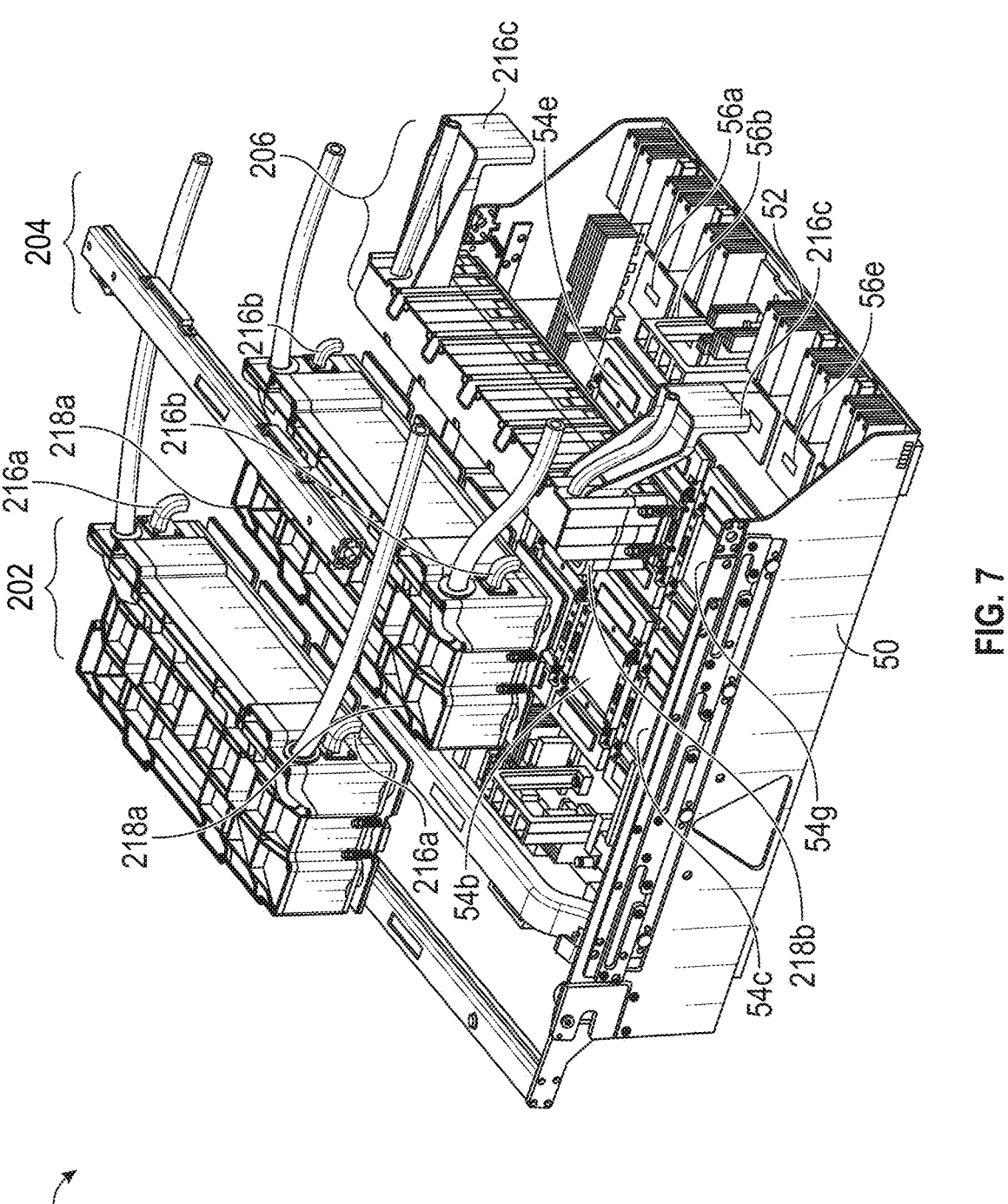
FIG. 7 is an upper left front perspective view of the embodiment of a containment system of FIG. 5 in a use case.

FIG. 1 is an upper right front perspective view illustrating a liquid cooling system 10 of the prior art. In FIG. 1. Delta cold plate system 10 includes cold plates 20a . . . 20h connected to coolant supply fitting 16 via: cold plate inlets 24, tubing connectors 68, supply manifolds 12, and cold plate inlet tubing 62. Cold plates 20a . . . 20h are connected to coolant return fitting 18 via: cold plate returns 26, tubing connectors 70, return manifolds 14, and cold plate inlet tubing 64. Delta cold plate system 10 further includes cold plates 22a . . . 22f connected to coolant supply fitting 16 via cold plate inlets 25, serial tubing connectors 66, and inlet tubing 62. Cold plates 22a . . . 22f are connected to coolant return fitting 18 via cold plate returns 27, serial tubing connectors 66, and return tubing 64. Fasteners 58 are used to connect each cold plate 20n to a heat-producing device beneath, e.g., GPU 54n (FIG. 7). Fasteners 59 are used to connect each cold plate 22n to a heat-producing device beneath, e.g., Nvlink 56n (FIG. 7). Cold plates 22a . . . 22f are connected to coolant return fitting 18 via: cold plate returns 27, serial tubing connectors 66, and return tubing 64. Connection manifolds 16, 18 are configured to connect to system coolant supply and return fittings within a server rack system (not shown).

Liquid cooling system 10 typically sits directly atop the devices being cooled. Thus, any leakage from system 10 has the potential to flow onto and short circuit device electrical connections.

Figure 2:
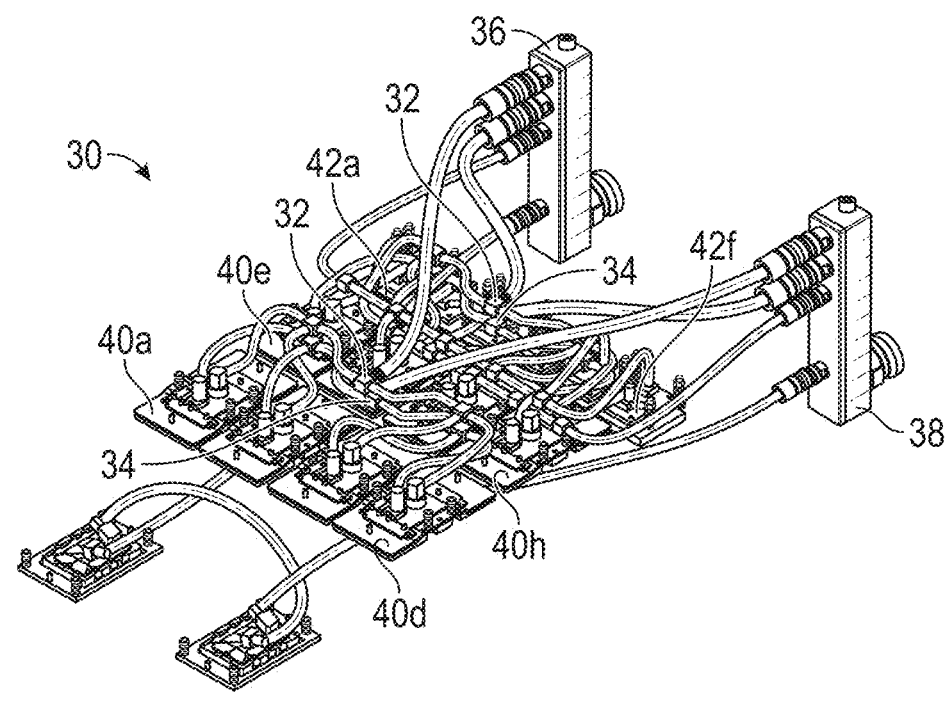
FIG. 2 is an upper right front perspective view illustrating a liquid cooling system of the prior art.

FIG. 2 is an upper right front perspective view illustrating a liquid cooling system 30 of the prior art. In FIG. 2, similar to Delta system 10, Cooler-Master cold plate system 30 includes cold plates 40a . . . 40h connected to coolant supply fitting 36 via: cold plate inlets, tubing connectors, and supply T-connectors 32. Cold plates 40 . . . 40h are connected to coolant return fitting 38 via: cold plate returns, tubing connectors, and return T-connectors 34. Cooler-Master cold plate system 30 further includes cold plates 42a . . . 42f connected to coolant supply fitting 36 via cold plate inlets, tubing connectors, and supply T-connectors 32. Cold plates 42a . . . 42f are connected to coolant return fitting 38 via cold plate returns, tubing connectors, and return T-connectors 34. Fasteners are used to connect each cold plate 40n to a heat-producing device beneath, e.g., GPU 54n (FIG. 7) and to connect each cold plate 42n to a heat-producing device beneath, e.g., Nvlink 56n (FIG. 7). Cold plates 22a . . . 22f are connected to coolant return fitting 18 via: cold plate returns 27, serial tubing connectors 66, and return tubing 64. Connection manifolds 36, 38 are configured to connect to system coolant supply and return fittings within a server rack system (not shown).

Liquid cooling system 30 typically sits directly atop the devices being cooled. Thus, any leakage from system 30 has the potential to flow onto and short circuit device electrical connections. In addition, the complexity of the tubing routing may result in kinking or dislocation more pronounced that any experienced by Delta system 10.

In the systems of FIG. 1 and FIG. 2, cold plates 20n, 40n are sized for GPUs or APUs and cold plates 22n, 42n are sized for Nvlink switches that provide GPU to GPU or APU to APU connections. However, the cold plates may be configured for other heat-producing devices without departing from the teachings of this disclosure.

Figure 3:
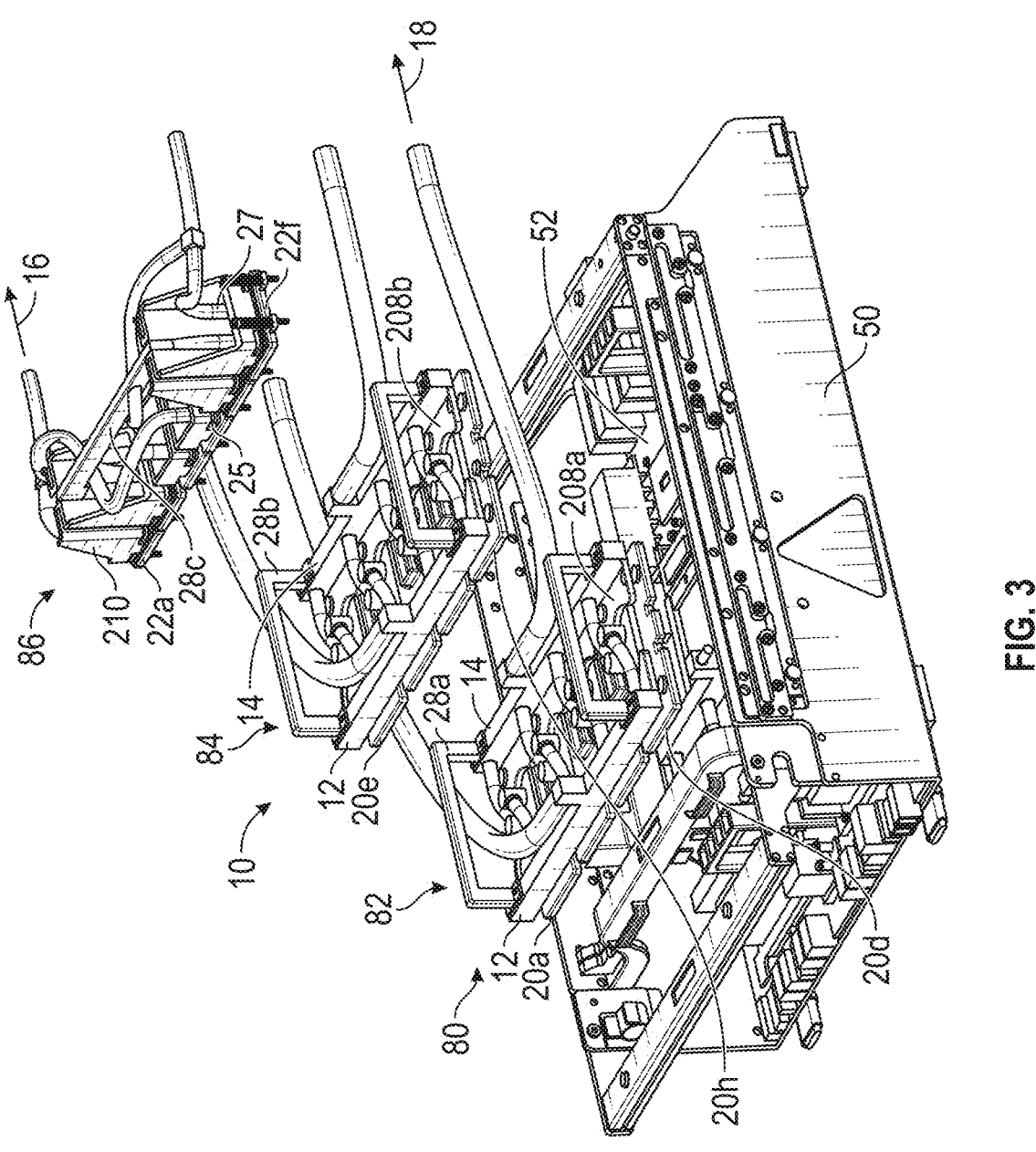
FIG. 3 is an upper right front perspective view illustrating an embodiment of a the liquid cooling system of FIG. 1 and a server chassis of the prior art.
Figure 10:
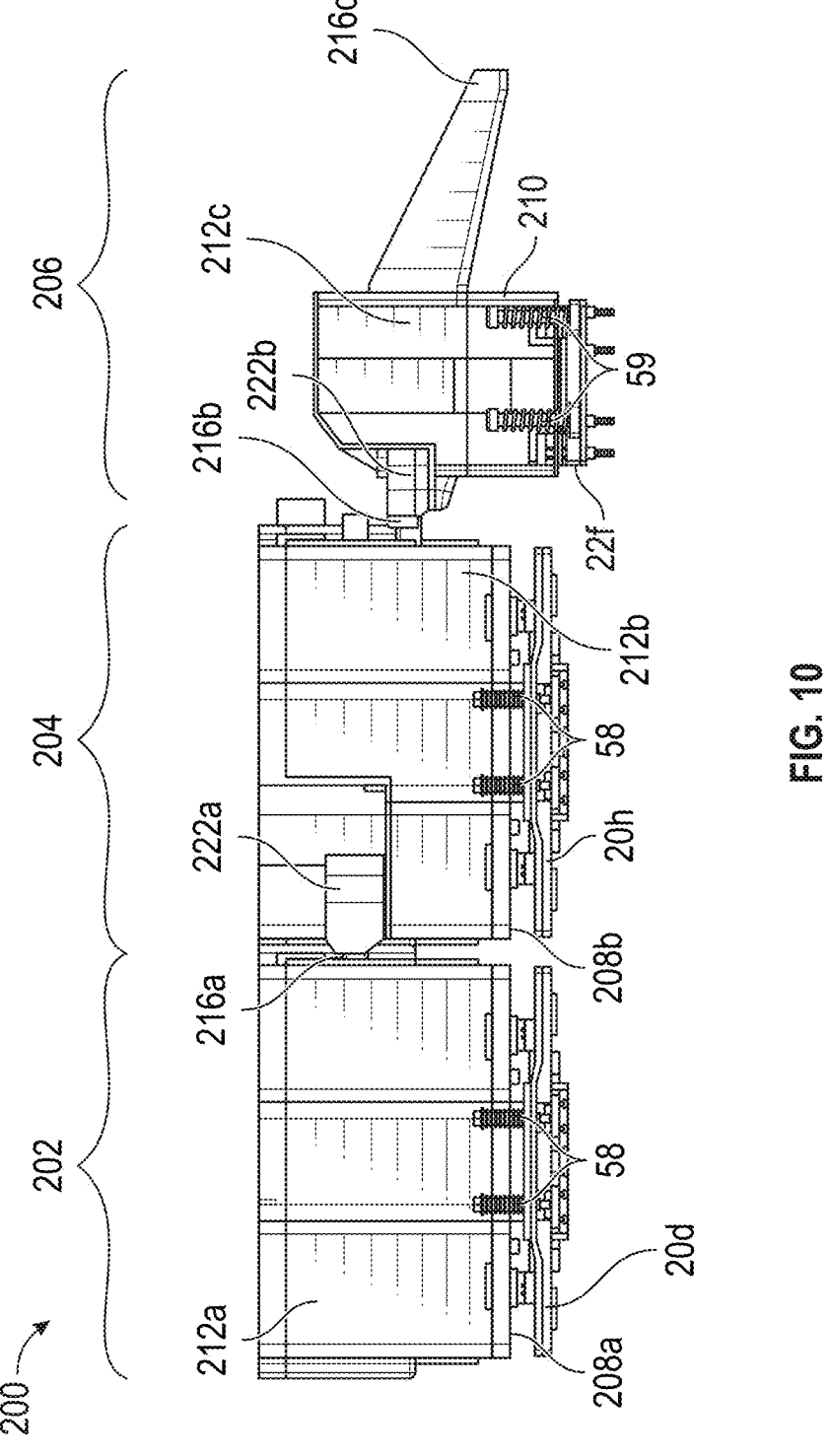
FIG. 10 is a left side view of the embodiment of a containment system of FIG. 5.

FIG. 3 is an upper right front perspective view illustrating an embodiment of a cold-plate positioning system 80. Positioning system 80 may be attached to liquid cooling system 10 of FIG. 1 and used to facilitate positioning cooling system 10 within a server chassis 50. A feature of cold-plate positioning system is its modularity, which provides for easy service of subsets of cold plates. Floating system 80 includes handles 28a . . . 28c and floating trays 208a. 208b, 210. To use floating system 80, floating trays 208a, 208b are each attached to a plurality of cold plates cold plates 20a . . . 20d, 20e . . . 20f, respectively. Similarly, floating tray 210 is connected to cold plates 22a . . . 22f. Manifolds 12, 14 are then attached to each floating tray 208a, 208b. Cold plates 20a . . . 20h, 22a . . . 22f are then hydraulically connected to supply and return manifolds 16, 18 as described with regard to FIG. 1. Afterwards, each assembled floating cold plate module 82, 84, or 86 may be lowered into position (e.g., using handles 28a . . . 28c) atop the GPUs and Nvlinks of baseboard 52 and fixed into place independently of the others. Similarly, each floating cold plate module 82, 84, or 86, may be removed independently of the others for service. Floating trays 208a, 208b, 210 and their connection to their respective cold plates are further described within with regard to FIG. 5. FIG. 10, and later figures.

Figures 4A, 4B:
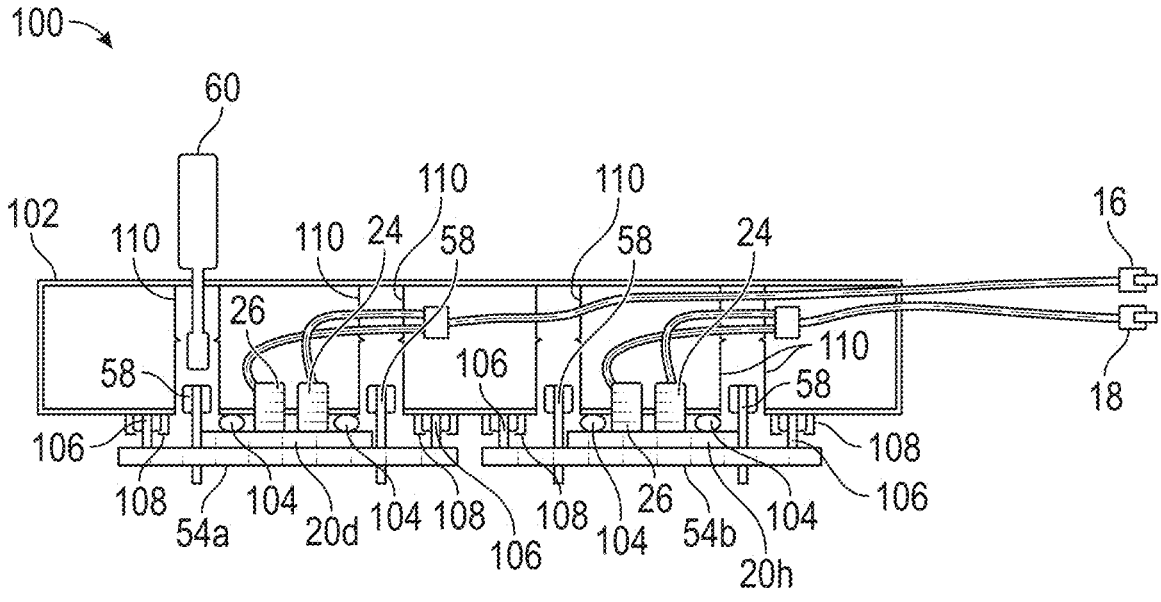
FIG. 4A is a right side schematic view illustrating an embodiment of a containment system.
FIG. 4B is an upper right front perspective view of a use case for the containment system of FIG. 4A.

FIG. 4A is a right side schematic view illustrating an embodiment of a containment system 100. FIG. 4B is an upper right front perspective view of a use case for containment system 100 of FIG. 4A. In FIG. 4A, containment system 100 includes a containment tray 104, gaskets 104, and shoulder screws 106. In FIG. 4A, only two cold plates 20d, 20h are shown, however, the containment tray may be expanded and configured to cover an arbitrarily large number of cold plates, e.g., cold plates 20a . . . 20h (as illustrated in FIG. 4B), or contracted to a single cold plate, e.g., 20d. Containment tray 104 may be connected to each cold plate by shoulder screws 106 within screw slots 108, with cold plate inlets 24 and returns 26 being received through ports in the base of containment tray 104. Gaskets 104 are provided that surround each pair of inlet 24 and return 26. As shoulder screws 106 are tightened, gaskets 104 are compressed between the base of containment tray 104 and the tops of cold plates 20d, 20h. Thus, gaskets 104 create seals between containment tray 104 and cold plates 20d, 20h, which retain leakage from the cold plate inlet and return tubing within containment tray 104 and to the top areas of cold plates 20d, 20h within the space defined by gaskets 104. In the embodiment, containment tray includes chimney accesses 110 that enable using a tool 60 and attachment bolts 58 to connect the assembled containment system 100 and cold plates 20d, 20h to a baseboard atop APU/GPU modules.

In the embodiment of FIG. 4A and FIG. 4B, a single containment tray is provided over a plurality of heat-producing devices, e.g., APUs or GPUs. For each associated cold plate, a gasket creates a seal between the cold plate and the heat producing devices to prevent leakage, e.g., from the coolant inlet and return lines, from reaching and destroying the underlying heat-producing device. In the embodiment, the seal of each gasket is ensured by the containment tray being bolted to each cold plate. In other embodiments, the clamping force needed to ensure the seals may be provided by other means, e.g., a different distribution of shoulder screws 106, or a bracket that clamps containment tray 104 to the chassis or motherboard.

Figure 5:
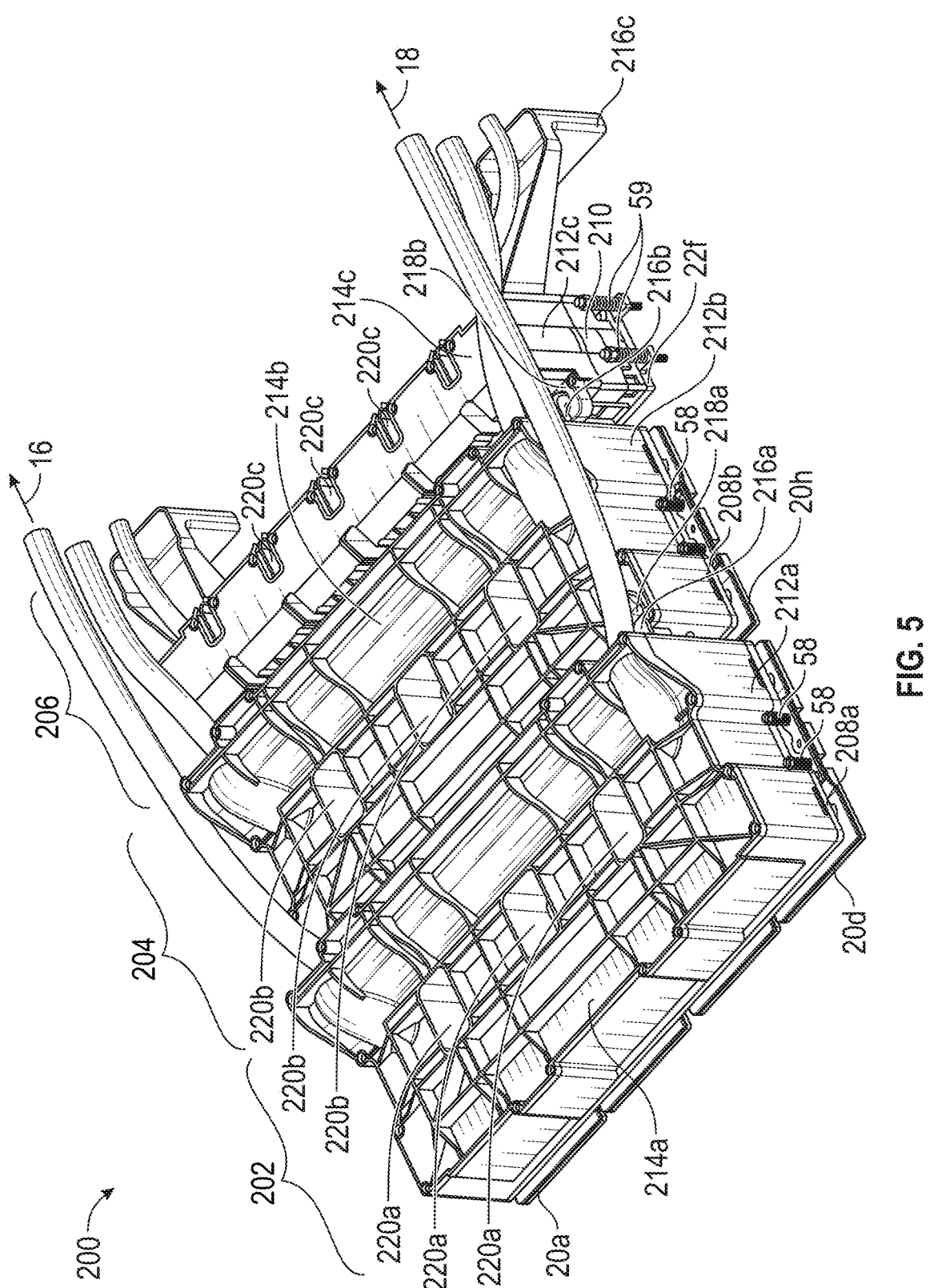
FIG. 5 is an upper right front perspective view of an embodiment of a containment system.

FIG. 5 is an upper right front perspective view of an embodiment of a containment system 200. In FIG. 5, containment system 200 includes containment modules 202, 204, 206. Containment modules 202, 204 are each configured to attach to four cold plates (20a . . . 20d or 20e . . . 20h) that are themselves configured to cool four heat-producing devices, e.g., APUs or GPUs 54 (54a . . . 54d or 54e . . . 54h, FIG. 7). Containment module 206 is configured to attach to six cold plates (22a . . . 22f) that are themselves configured to cool six differently sized heat-producing devices, e.g., Nvlink switches 56a . . . 56f. In modules 202, 204, containment trays 212a, 212b are connected to floating trays 208a, 208b, which are connected to cold plates 20a . . . 20d, 20e . . . 20h, respectively. In module 206, containment tray 212c is connected to floating tray 210, which is connected to cold plates 22a . . . 22f. Each module includes an optional lid 214a . . . 214c. And each lid includes access ports 220a, 220b, or 220c, which provide access to attachment bolts 58 or 59 for securing the cold plates to the associated heat producing devices.

In the embodiment, module 202 includes a spout 216a through which coolant exits the module when leakage exceeds the capacity of containment tray 212a and the base of tray 212a is horizontal. Spout 216a directs the overflow coolant into a drain 218a in lid 214b of containment tray 212b. Similarly, module 204 includes a spout 216b through which coolant exits the module when leakage exceeds the capacity of containment tray 212b and the base of tray 212b is horizontal. Spout 216b directs the overflow coolant into a drain 218b in lid 214c of containment tray 212c. Finally, module 206 includes a spout 216c through which coolant exits the module when leakage exceeds the capacity of containment tray 212c and the base of tray 212c is horizontal. Spout 216c is configured to direct the overflow coolant out of server chassis 50, which accounts for it being extended in comparison to spouts 216a, 216b. Such overflow coolant may then be received by, e.g., a floor drain or by additional plumbing for collection and re-use. Thus, for coolant to flow from tray 212a to 212b, from 212b to 212c, and from 212c out of server chassis 50, when containment trays 212a . . . 212c are oriented horizontally, an initial lip 224a of spout 216a is higher than an initial lip 224b of spout 216b, which is higher than an initial lip 224c of spout 216c, creating a cascade from containment tray 212a to the exterior of server chassis 50.

Figure 6:
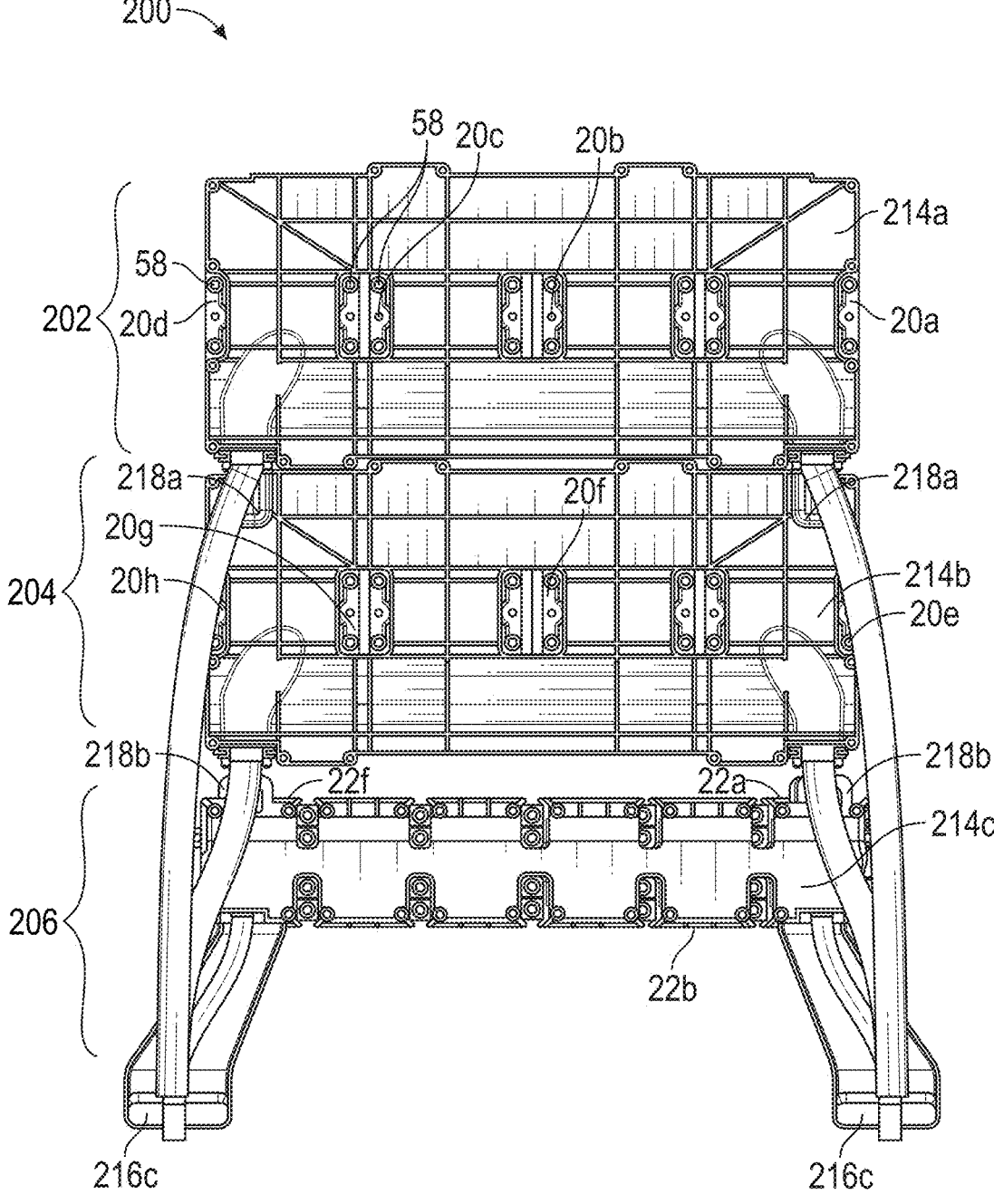
FIG. 6 is a top view of the embodiment of a containment system of FIG. 5.

FIG. 6 is a top view of the embodiment of containment system 200 of FIG. 5. FIG. 6 illustrates that access ports 220a. 220b, 220c, provide access through their associated containment tray to the attachment bolts 58 or 59 that secure the cold plates to the associated heat producing devices.

FIG. 7 is an upper left front perspective view of the embodiment of containment system 200 of FIG. 5 in a use case in which containment system 200 contains and discharges coolant leakage from cold plates 20a . . . 20h, 22a . . . 22f associated with GPU/APU modules 54a . . . 54h and Nvlink switch 56a . . . 56h, on baseboard 52 of server chassis 50. FIG. 7 illustrates that module 202 is associated with GPU/APU modules 54a . . . 54d, module 204 with GPU/APU modules 54e . . . 54h, and module 206 with Nvlink switches 56a . . . 56f.

Figure 8:
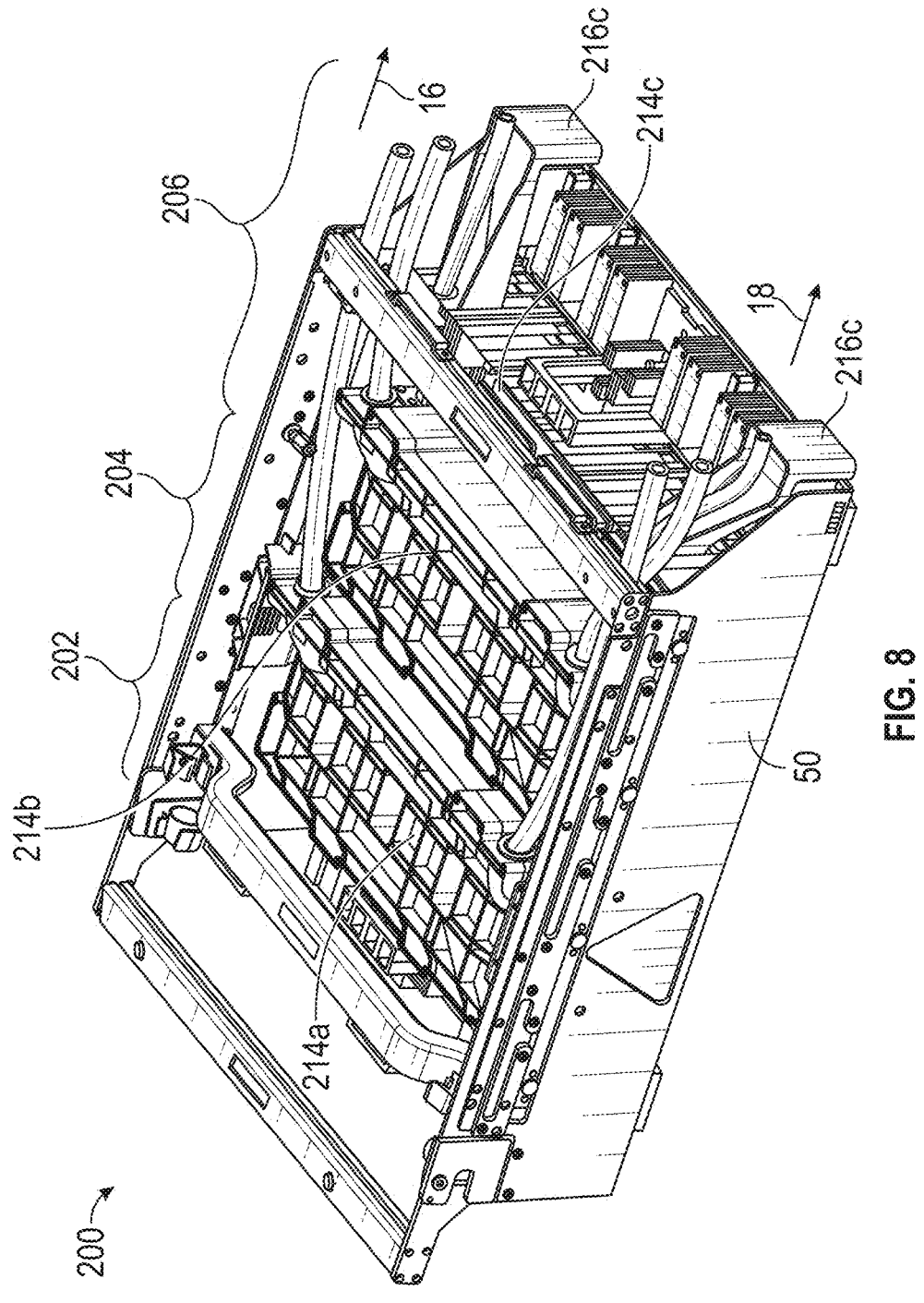
FIG. 8 is an upper left front perspective view of the embodiment of a containment system of FIG. 5 in a use case.

FIG. 8 is an upper left front perspective view of the embodiment of containment system 200 of FIG. 5 in the use case of FIG. 7. FIG. 8 illustrates that module 202 is relatively taller than module 204, which is relatively taller than module 206, thereby creating a leakage cascade from module 202 to the exterior of server chassis 50.

Figure 9:
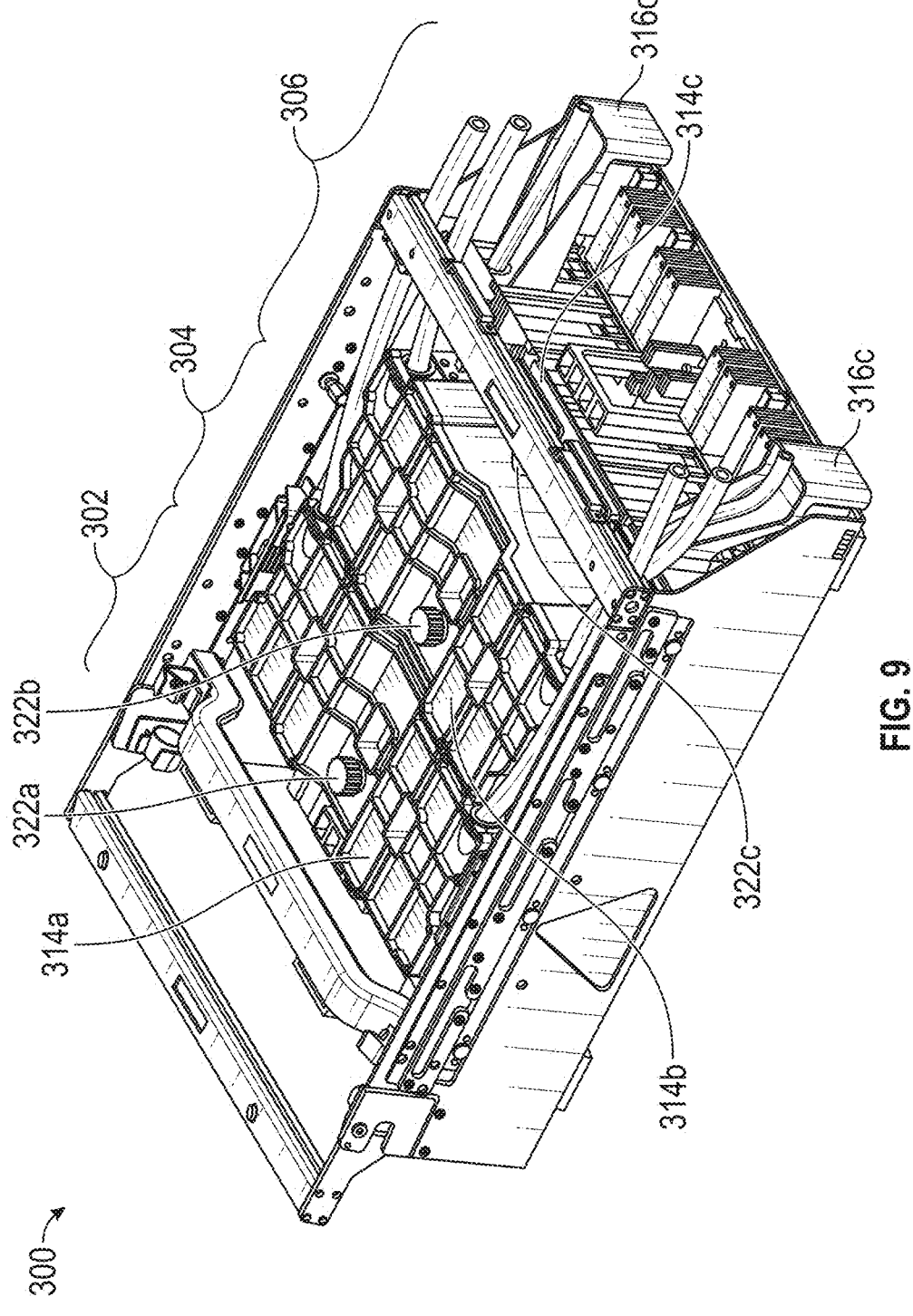
FIG. 9 is an upper left front perspective view of an embodiment of a containment system in a use case.

FIG. 9 is an upper left front perspective view of an embodiment of a containment system 300 in the use case of FIG. 7. In containment system 300, modules 302, 304, and 306 are similar to modules 202, 204, 206 of system 200 (e.g., a spout 316c is identical to spout 216c of system 200), except for features regarding optional lids 314a . . . 314c. In containment system 300, lids 314a . . . 314c each include a capped access port 322a . . . 322c, which may be removed for access to the interior of the containment trays. Such access may be used to, e.g., insert a hose to suction coolant from the containment tray.

FIG. 10 is a left side view of containment system 200 of FIG. 5. In FIG. 10, cold plates 20d, 20h are shown to be elevated in comparison to cold plate 22f. This illustrates that, in embodiments, the heights of the heat-producing devices may be different and yet the embodiment may be adapted to account for the differences and still provide a flow path that cascades from an initial module to a point external to the server chassis. In FIG. 10, funnels 222a, 222b are located about drains 218a, 218b to guide coolant from spouts 216a, 216b into drains 218a, 218b, respectively.

Figure 11:
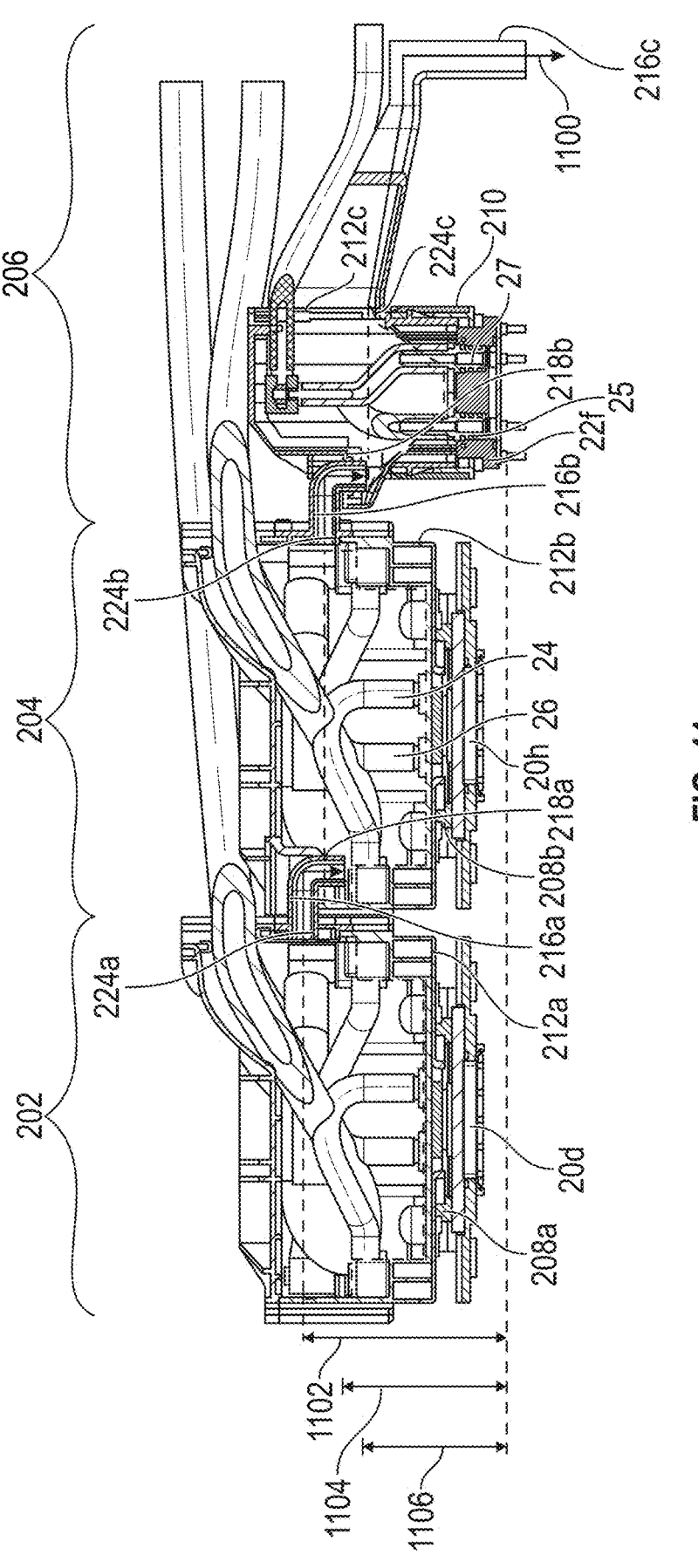
FIG. 11 is a partially transparent left side view of the embodiment of a containment system of FIG. 5.

FIG. 11 is a partially transparent left side view of containment system 200 of FIG. 5. In FIG. 11, when tray 212c is oriented horizontally, a flow 1100 external to server chassis 50 is created when leakage coolant in containment tray 212c exceeds a height 1106 of a lip 224 at the entrance to spout 216c. Similarly, leakage coolant is added to tray 212c when leakage coolant in containment tray 212b exceeds a height 1104 of a lip in spout 216b. And leakage coolant is added to tray 212b when leakage coolant in containment tray 212a exceeds a height 1102 of a lip in spout 216a.

Figure 12:
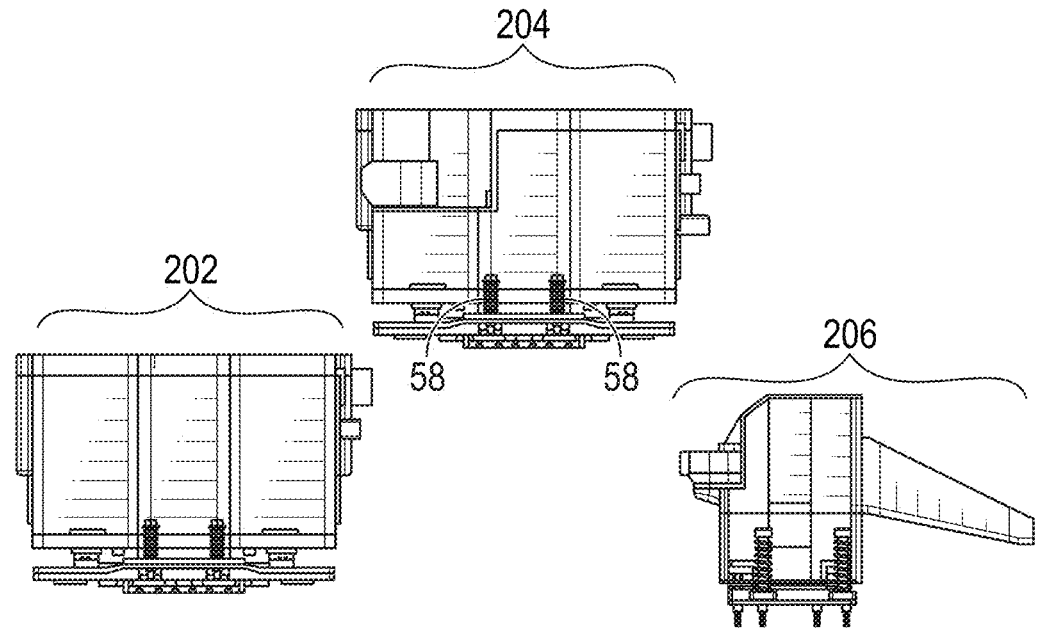
FIG. 12 is a left side view of the embodiment of a containment system of FIG. 5 partially disassembled.

FIG. 12 is a left side view of containment system 200 of FIG. 5, partially disassembled. In FIG. 12, module 204 is shown elevated in comparison to modules 202 and 206 to illustrate that each module may be removed from chassis 50 independently from the other modules. Thus, the connections between the other modules and their respective cold plates and heat-producing devices need not be disturbed. This separability therefore reduces the potential issues that arise from repeated connections and disconnections and the related wear on the parts and potential for error in making the connections. In FIG. 12, spout 216A has been modified to a straight-out spout (without using a right angle), and its length has been minimized. Given that tubing 62, 64 is flexible, combined with the gaps between each module 202, 204, 206, the removal of the middle module 204 is achieved by detaching screws from 58 from the GPU mounting feature, lifting module 204 slightly, and moving it toward module 206 until there is enough distance to allow tubing 62, 64 of module 202 to bend enough that module 204 may be raised upward and removed.

Figure 13A:
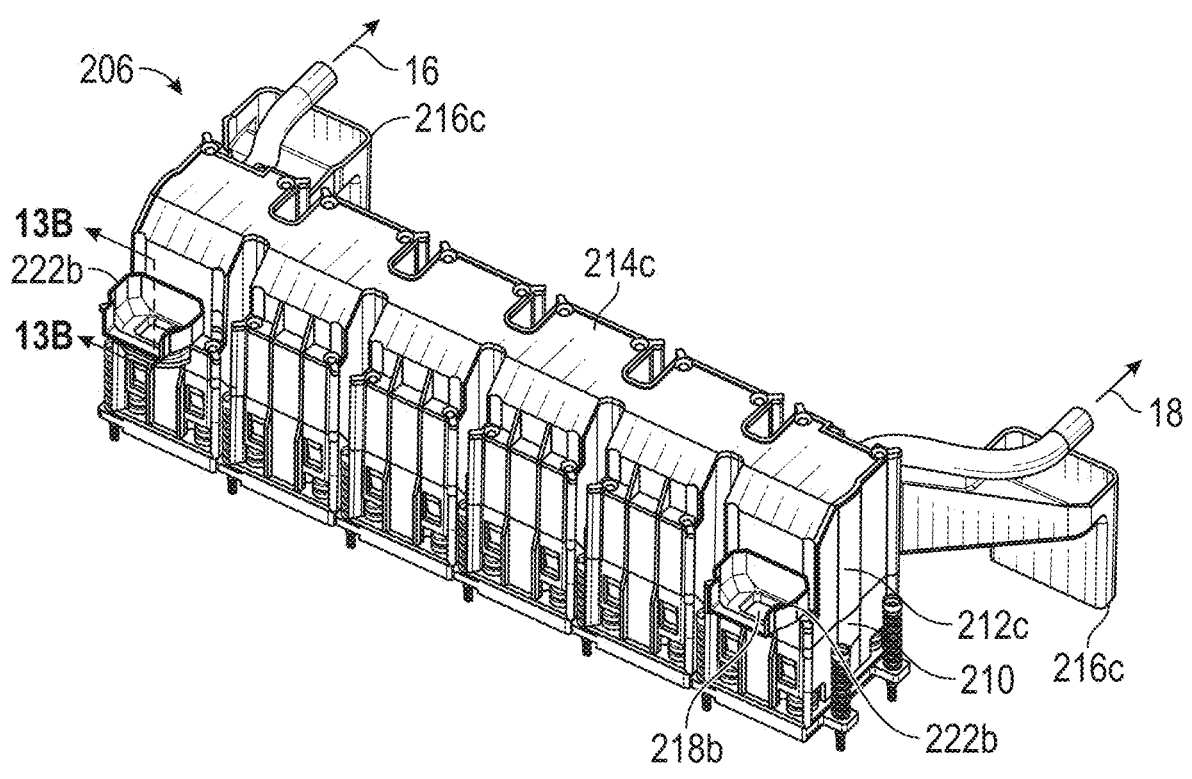
FIG. 13A is an upper left rear perspective view of aspects of the embodiment of a containment system of FIG. 5.
Figure 13B:
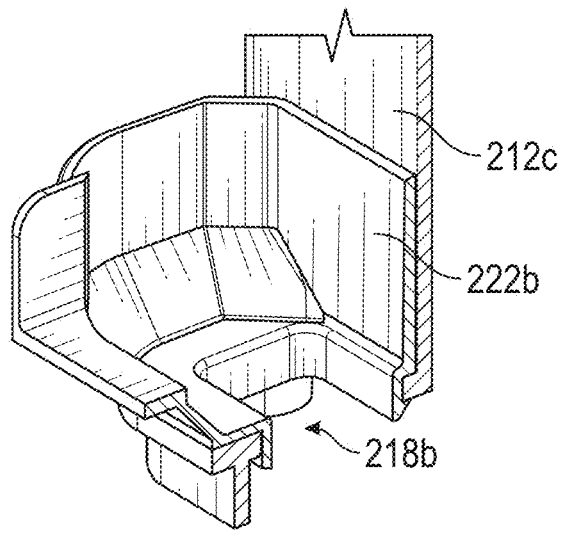
FIG. 13B is an upper left rear perspective view of aspects of the embodiment of a containment system illustrated in FIG. 13A.

FIG. 13A is an upper left rear perspective view of aspects of containment system 200 of FIG. 5. FIG. 13B is an enlargement of a section of FIG. 13A. In FIG. 13A and FIG. 13B, funnels 222b of module 206 are shown to assist in directing flow into drains 218b.

Figure 13C:
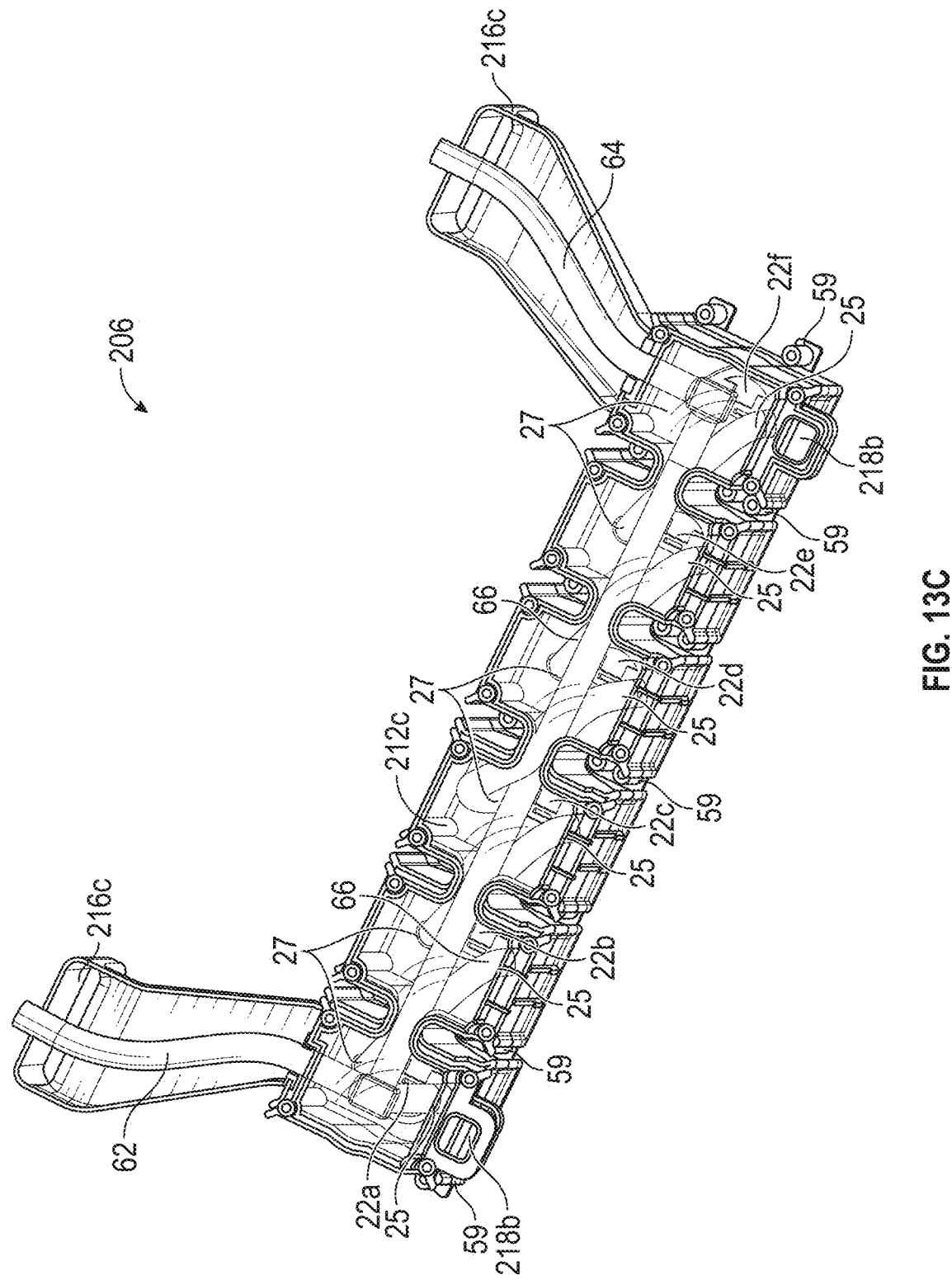
FIG. 13C is an upper left rear perspective view of aspects of the embodiment of a containment system of FIG. 13A, partially disassembled.

FIG. 13C is an upper left rear perspective view of aspects of containment system 200 of FIG. 13A, partially disassembled. In FIG. 13C, lid 214c has been removed from module 206 to reveal the distribution of inlet tubing 62, return tubing 64, and serial tubing connectors 66, all within containment tray 212c. As shown, supply tubing 62 is directly connected to inlets 25 of cold plates 22a, 22d. Return tubing 64 is directly connected to returns 27 of cold plates 22c, 22f. Serial tubing connectors 66 connect inlets 25 to returns 27, serially connecting cold plates 22a . . . 22c and 22d . . . 22f. In addition, removing lid 214c shows that inlets 25 and returns 27 extend into containment tray 212c through ports in the bottom of tray 212c.

Figure 14:
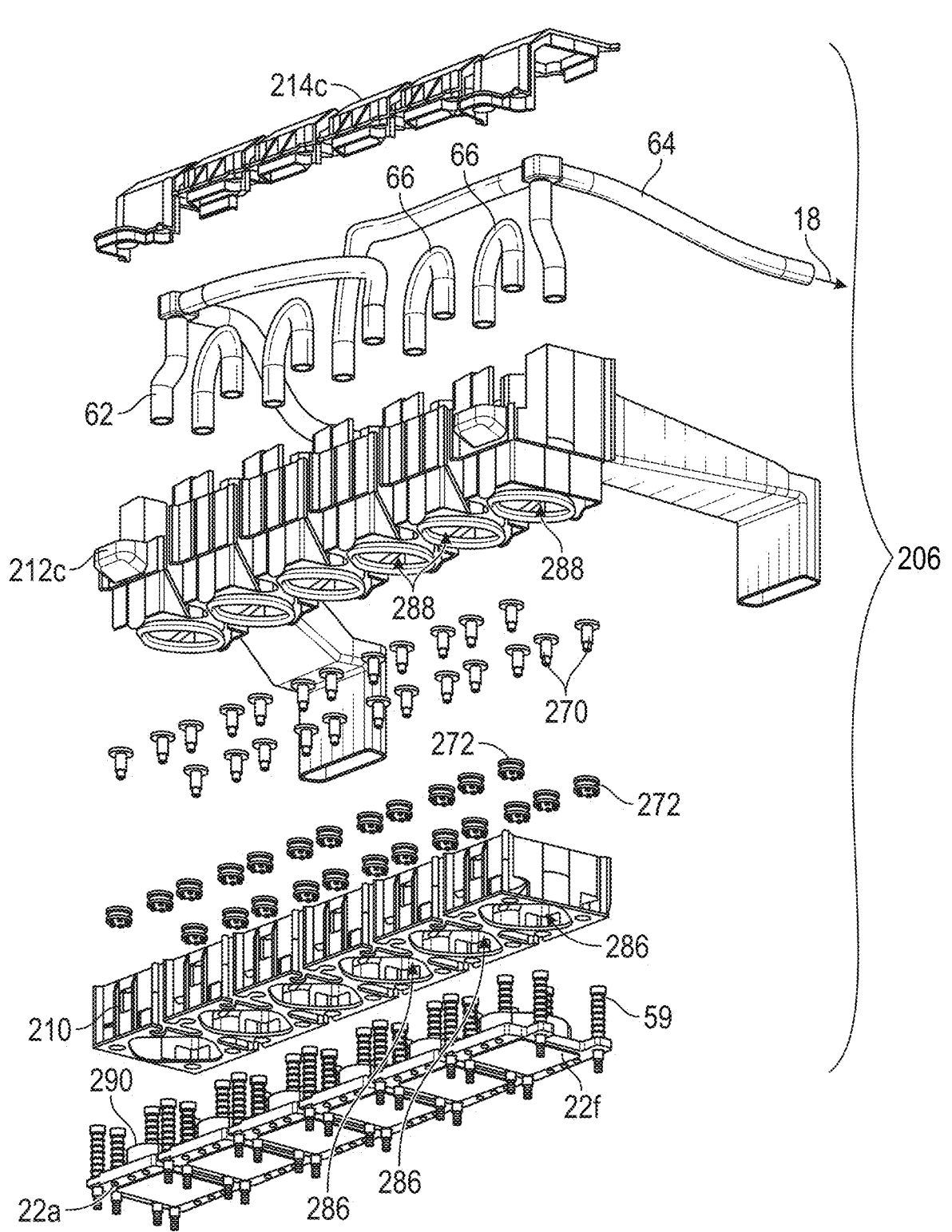
FIG. 14 is an assembly drawing of aspects of the embodiment of a containment system illustrated in FIG. 13A.

FIG. 14 is an assembly drawing of module 206 illustrated in FIG. 13A. In FIG. 14, when assembled, face elements 290 of cold plates 22a . . . 22f are received through ports 286 at the base of floating tray 210. Shoulder screws 272 and grommets 272 cooperate with holes in floating tray 210 to connect floating tray 210 to cold plates 22a . . . 22f. Grommets 272 seal between screws 270 and the screw hole upon screws 270 being tightened. Gaskets 268 abut face elements 290 of cold plates 22a . . . 22f. Inlets 25 and returns 27 (not shown in FIG. 14) of cold plates 22a . . . 22f are received within tray 212c by ports 288. Containment tray 212c compresses gaskets 268 against face elements 290 to complete the seal between containment tray 212c and the cold plates such that any coolant in containment tray 212c does not escape between tray 212c and cold plates 22a . . . 22f.

Figures 15A, 15B:
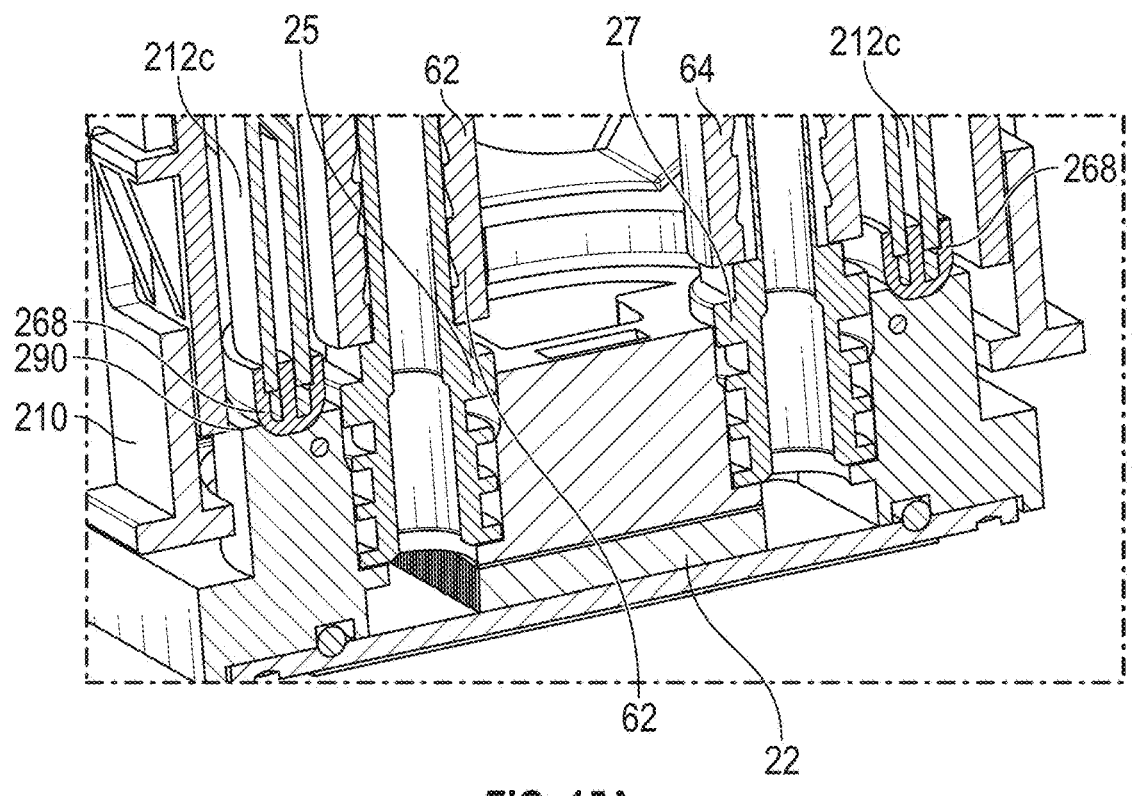
FIG. 15A is a cross-section illustrating aspects of the embodiment of a containment system illustrated in FIG. 13A.
FIG. 15B is a cross-section illustrating aspects of the embodiment of a containment system illustrated in FIG. 13A.

FIG. 15A and FIG. 15B are cross-sections illustrating aspects of module 206 of FIG. 13A. In FIG. 15A, gasket 268 is shown to be compressed between containment tray 212c and face elements 290. In addition, inlet 25 and return 27 are shown to be received within tray 212c through port 288. In FIG. 15B, should screws 270 and grommets 272 are shown to cooperate to seal floating plate 210 to cold plate 22. The compression of gasket 268 between tray 212c and face elements 290 is also further illustrated. During assembly, floating tray 210 is installed first onto cold plates 22a . . . 22f. Then, containment tray 212c, which is equipped with plastic retainment features, is pressed into floating tray 210 until it snaps securely into place within floating tray 210. The clamping force between floating 210 and containment tray 212c compressed gasket 268.

Figure 16A:
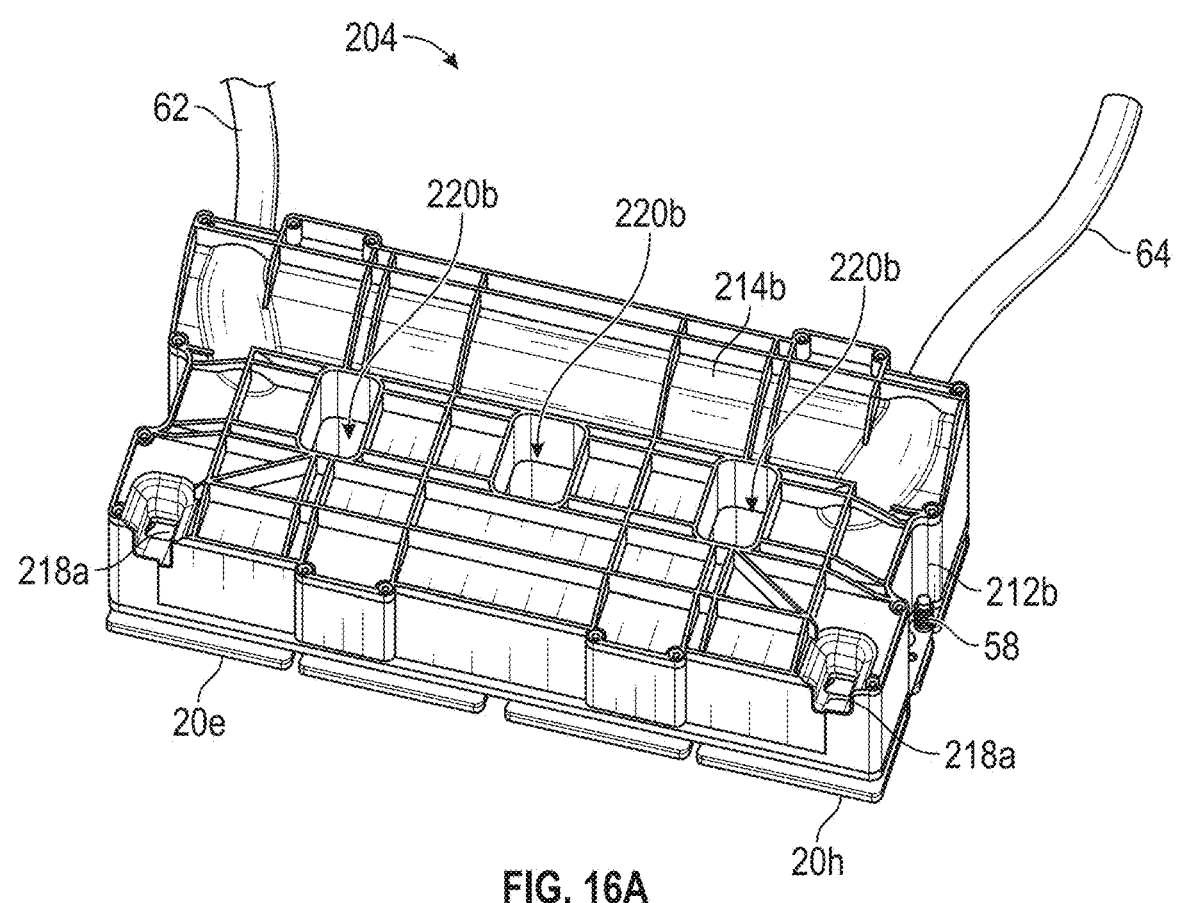
FIG. 16A is an upper left rear perspective view of aspects of the embodiment of a containment system of FIG. 5.

FIG. 16A is an upper left rear perspective view of aspects of module 204 of containment system 200 of FIG. 5. FIG. 16A clarifies the positions of drains 218a and access ports 220b in lid 214b.

7

Figure 16B:
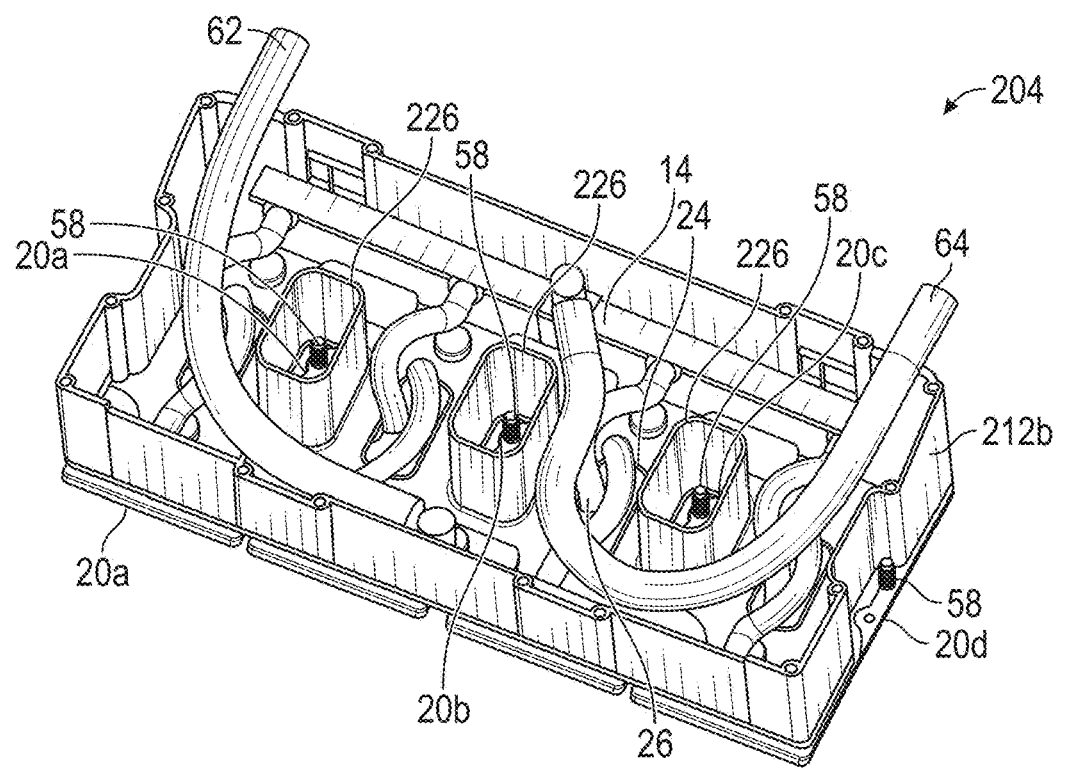
FIG. 16B is an upper left rear perspective view of aspects of the embodiment of a containment system of FIG. 16A, partially disassembled.

FIG. 16B is an upper left rear perspective view of aspects of module 204 of containment system 200 of FIG. 16A, partially disassembled. In FIG. 16B, lid 214b has been removed from module 204 to reveal the distribution of inlet tubing 62, return tubing 64, and return manifold 14, all within containment tray 212b. Supply manifold 12 is directly connected to each inlet 24 of cold plates 20e . . . 20h. Return manifold 14 is similarly directly connected to returns 26. Removing lid 214b illustrates that inlets 24 and returns 26 extend into containment tray 212b through ports in the bottom of tray 212b. Furthermore more, chimneys 226 are shown to provide access to attachment bolts 58 and to extend up to the height of the edges of tray 212b to prevent fluid from escaping onto cold plates 20e . . . 20h through chimneys 226. In FIG. 16B, spouts 216b are obscured by tubing 62, 64.

In embodiments, module 202 is substantially similar to module 204, with the differences including that tray 212a is taller than tray 212b to facilitate lip 224a of tray 212a being relatively higher than lip 224b of tray 212b. In addition, lid 214a need not be provided with a drain.

Figure 17A:
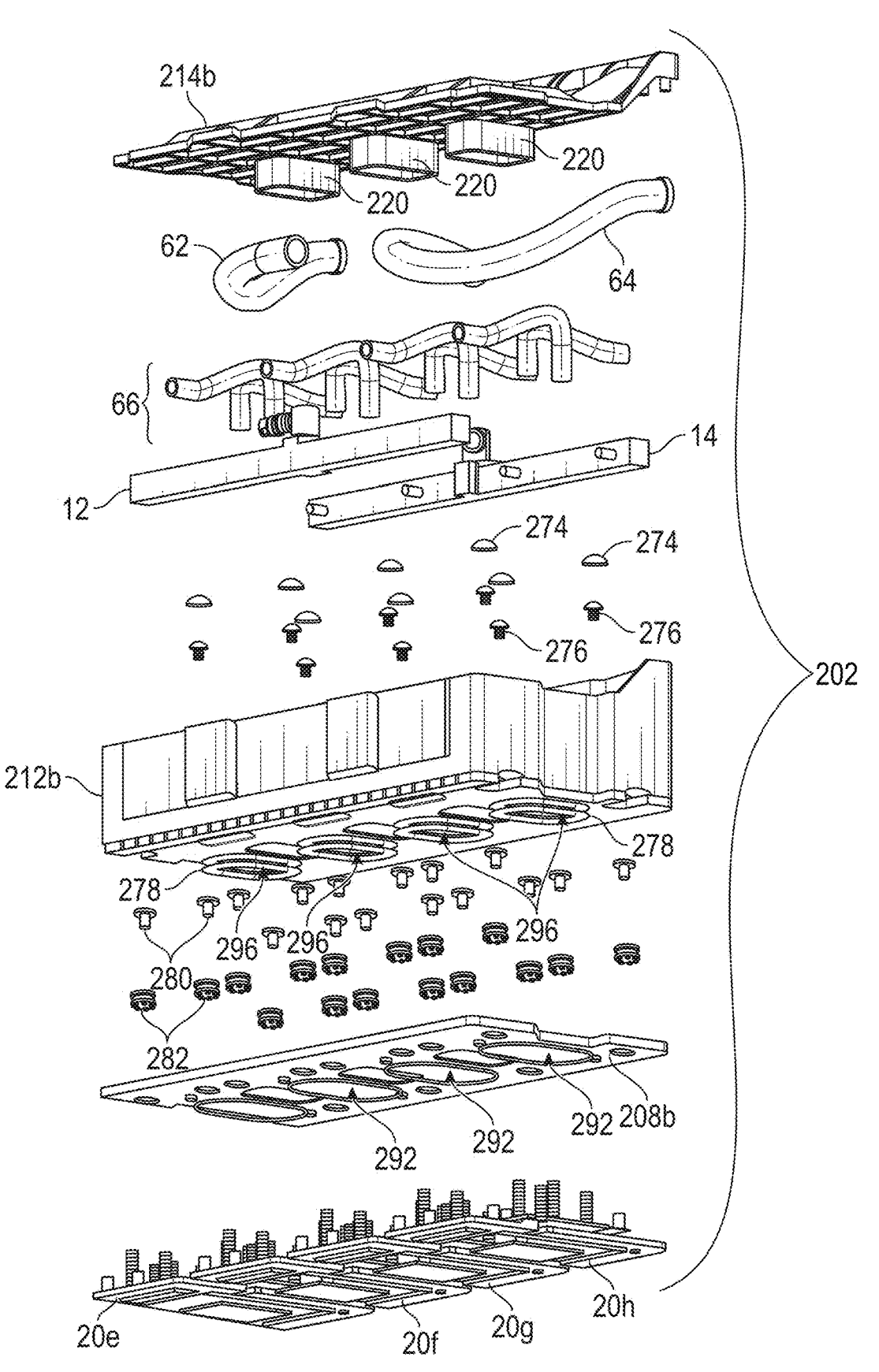
FIG. 17A is an assembly drawing of aspects of the embodiment of a containment system illustrated in FIG. 16A.
Figure 17B:
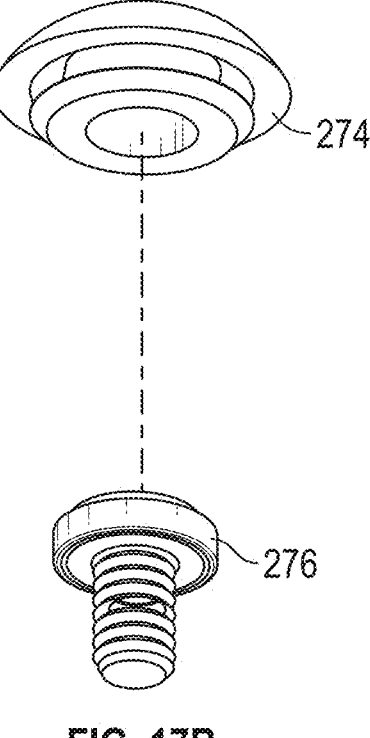
FIG. 17B is an assembly drawing of a head screw and hole plug/cap used in the containment system illustrated in FIG. 16A.

FIG. 17A is an assembly drawing of module 204 illustrated in FIG. 16A. In FIG. 17A, when assembled, gaskets 278 are compressed between face elements 292 of cold plates 20e . . . 20h and containment tray 212b. Inlets 22 and returns 24 are received through ports 294 at the base of floating tray 208b and ports 296 at the base of containment tray 212b. Head screws 276 and hole plug/caps 274 connect tray 212b to floating tray 208b. Screws 280 and grommets 282 cooperate with flanges 284 to connect floating tray 208b to cold plates 20e . . . 20h. Grommets 282 seal between screws 280 and the screw hole upon screws 280 being tightened. Gaskets 278 abut face elements 292 of cold plates 20e . . . 20h. Thus, the connection of containment tray 212b to floating tray 208b, and the connection of floating tray 208b to cold plates 20e . . . 20h, compresses gaskets 278 between tray 212b and face elements 292 to complete the seal between containment tray 212b and the cold plates such that any coolant in containment tray 212b does not escape between tray 212b and cold plates 20e . . . 20h.

Figure 18A:
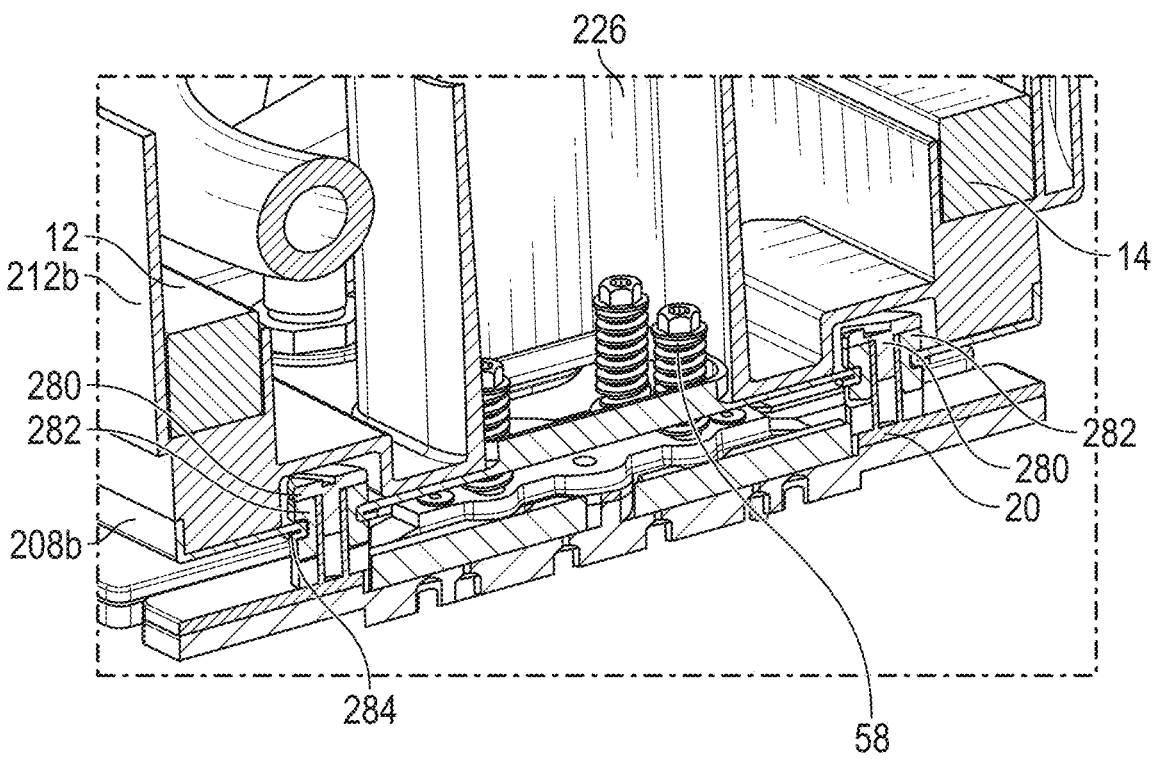
FIG. 18A is a cross-section illustrating aspects of the embodiment of a containment system illustrated in FIG. 16A.
Figure 18B:
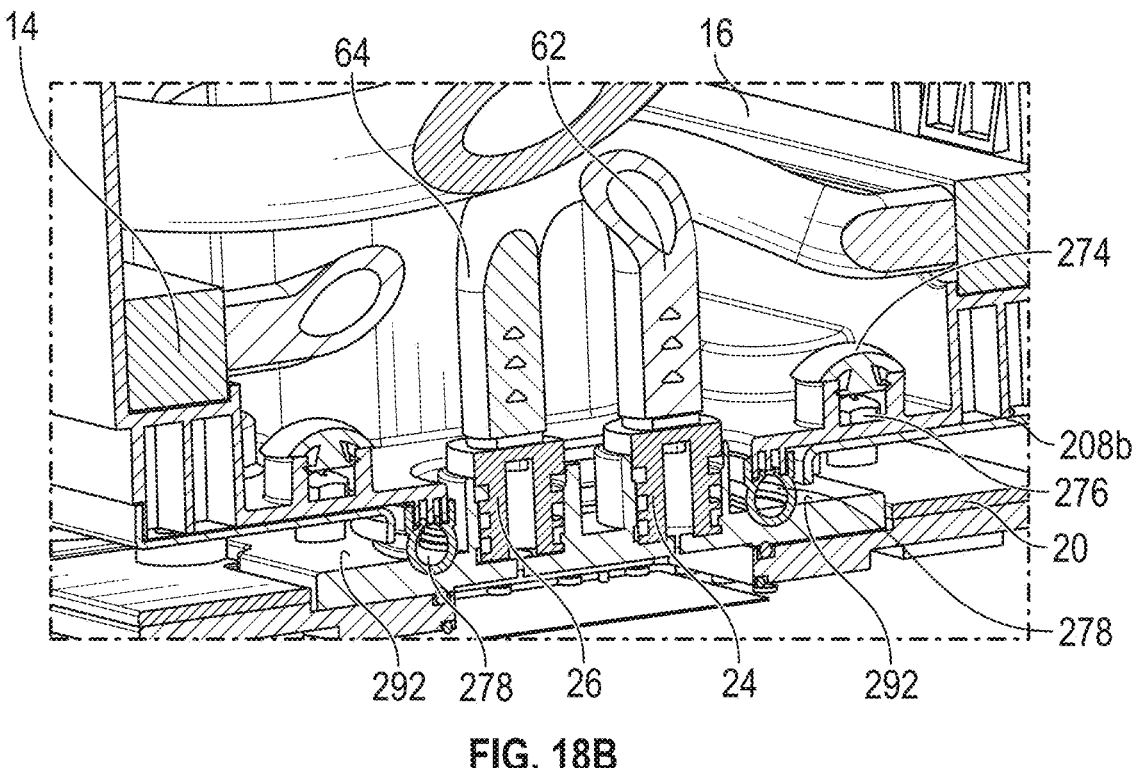
FIG. 18B is a cross-section illustrating aspects of the embodiment of a containment system illustrated in FIG. 16A.

FIG. 18A and FIG. 18B are cross-sections illustrating aspects of module 204 of FIG. 16A. In FIG. 18A, chimney 226 is shown to provide access to attachment bolts 58, for fastening cold plate 20 to a GPU module 54. The connection of floating tray 208b to cold plate 20 by screws 280 and grommets 282 is clarified. In FIG. 18B, tray 212b is shown to be connected to floating tray 208b by head screws 276 and gasket 278 compressed between tray 212b and face elements 292. In addition, inlet 24 and return 26 are shown to be received within tray 212b through floating tray port 294 and containment tray port 296.

In embodiments, floating trays 208n, 210 with grommets 272, 282 between the cold plate and the containment tray add flexibility to the system that facilitates a more-even compression of the gasket and improved resulting seal, and can accommodate operator error such that the effects, e.g., kinking, stretching of the tubes, may be reduced. In embodiments, grommets 272, 282 and gaskets 104, 268, 278 may be constructed from a silicone rubber. In addition, having separate modules, e.g., modules 202, 204, 206, allows the servicing of individual modules, or the devices beneath, without disturbing the other elements of the system, which reduces service time and the undue stressing of the other elements.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:
1. An apparatus comprising:
a first containment tray including at least one first lip, and at least one first access port and at least one first access chimney that provides access through the first containment tray and access to at least one first fastener, the at least one access chimney being configured to extend higher than the at least one first lip such that the first containment tray retains fluid up to the at least one first lip when the at least one first access port is sealed and the first containment tray is oriented horizontally, the first containment tray being clamped against the first associated surface using the at least one first fastener; and
a first gasket adjacent to a perimeter of the at least one first access port, the first gasket being configured to create a seal between the first containment tray and a first associated surface when the first containment tray is clamped against the first associated surface.

2. The apparatus of claim 1 wherein the associated surface includes a cold plate or a surface with a thermally conductive connection to a cold plate.

3. The apparatus of claim 1, wherein the first containment tray includes a first spout extending from the first lip.

4. The apparatus of claim 3, wherein the first containment tray includes a first drain located higher on the first containment tray than the first lip when the first containment tray is oriented horizontally.

5. The apparatus of claim 3, wherein the first containment tray includes a lid including, for each first access chimney, a first access port.

6. The apparatus of claim 5, wherein the lid includes a second access port providing access to an interior of the first containment tray.

7. The apparatus of claim 3, further comprising:

a second containment tray including at least one second lip and at least one second access port, the second containment tray retaining fluid up to the second lip when the at least one second access port is sealed and the second containment tray is oriented horizontally; and for each second access port, a second gasket adjacent to a perimeter of the second access port, the second gasket creating a seal between the second containment tray and a second associated surface when the second containment tray is clamped against the second associated surface, wherein:

the second lip is lower than the first lip when the first and second containment trays are oriented horizontally with the first spout positioned such that fluid overflow from the first containment tray is directed into the second containment tray.

8. The apparatus of claim 7, the second tray further including at least one second access chimney providing access through the second containment tray, wherein, for each second access chimney:

the second access chimney extends higher than the second lip when the second containment tray is oriented horizontally; and the second access chimney provides access to at least one second fastener, the second containment tray being clamped against the second associated surface using the at least one second fastener.

9. The apparatus of claim 8, wherein the second tray includes a second spout extending from the second lip.

10. An apparatus comprising:

a chassis including a first plurality of cold plates;

a first containment tray clamped to the first plurality of cold plates, the first containment tray including at least one first lip, at least one first access port and at least one first access chimney that provides access through the first containment tray to a cold plate from the first plurality of cold plates and access to at least one first fastener, the at least one access chimney being configured to extend higher than the at least one first lip such that the first containment tray retains fluid up to the at least one first lip when the at least one access port is sealed and the first containment tray is oriented horizontally, the first containment tray being clamped to the first plurality of cold plates using the at least one first fastener; and a first gasket adjacent to a perimeter of the at least one first access port, the first gasket being configured to create a seal between the first containment tray and the cold plate from the first plurality of cold plates.

11. The apparatus of claim 10, wherein the first containment tray includes a first spout extending from the first lip.

12. The apparatus of claim 11, wherein the first containment tray includes a first drain located higher on the first containment tray than the first lip when the first containment tray is oriented horizontally.

13. The apparatus of claim 11, wherein the first containment tray includes a lid including, for each first access chimney, a first access port.

14. The apparatus of claim 13, wherein the lid includes a second access port providing access to an interior of the first containment tray.

15. The apparatus of claim 11, further comprising:

a second plurality of cold plates within the chassis;

a second containment tray clamped to the second plurality of cold plates, the second containment tray including at least one second lip and at least one second access port, the second containment tray retaining fluid up to the second lip when the at least one second access port is sealed and the second containment tray is oriented horizontally; and for each second access port, a second gasket adjacent to a perimeter of the second access port, the second gasket creating a seal between the second containment tray and a cold plate from the second plurality of cold plates, wherein:

the second lip is lower than the first lip when the first and second containment trays are oriented horizontally with the first spout positioned such that fluid overflow from the first containment tray is directed into the second containment tray.

16. The apparatus of claim 15, the second tray further including at least one second access chimney providing access through the second containment tray, wherein, for each second access chimney:

the second access chimney extends higher than the second lip when the second containment tray is oriented horizontally; and the second access chimney provides access to at least one second fastener, the second containment tray being clamped against the second plurality of cold plates using the at least one second fastener.

17. The apparatus of claim 16, wherein the second tray includes a second spout extending from the second lip.

18. A method for mounting a plurality of cold plates, comprising:

clamping to a plurality of cold plates a containment tray including:

at least one lip and at least one access port, the containment tray retaining fluid up to the lip when the at least one access port is sealed and the containment tray is oriented horizontally;

for each access port, a gasket adjacent to a perimeter of the access port, the gasket creating a seal between the containment tray and a cold plate from the plurality of cold plates; and at least one access chimney providing access through the containment tray to a cold plate of the plurality of cold plates, each at least one access chimney providing access to a cold plate from the plurality of cold plates and extending higher than the lip when the containment tray is oriented horizontally;

guiding the plurality of cold plates to a desired position on a baseboard using the containment tray; and attaching the plurality of cold plates to a plurality of heat-producing devices by inserting at least one fastener through the at least one access chimney and connecting a cold plate of the plurality of cold plates to a head-producing device of the plurality of heat-producing devices.

* * * * *